United States Patent
Wakai

(10) Patent No.: US 10,903,057 B2
(45) Date of Patent: Jan. 26, 2021

(54) TEMPERATURE ADJUSTMENT DEVICE AND SUBSTRATE PROCESSING APPARATUS

(71) Applicant: Tokyo Electron Limited, Tokyo (JP)

(72) Inventor: Hideki Wakai, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 110 days.

(21) Appl. No.: 15/267,246

(22) Filed: Sep. 16, 2016

(65) Prior Publication Data

US 2017/0092471 A1    Mar. 30, 2017

(30) Foreign Application Priority Data

Sep. 24, 2015   (JP) .................... 2015-186728

(51) Int. Cl.
*H01J 37/32*    (2006.01)
*H01L 21/67*    (2006.01)

(52) U.S. Cl.
CPC .... *H01J 37/32724* (2013.01); *H01J 37/3244* (2013.01); *H01J 37/32082* (2013.01); *H01J 37/32697* (2013.01); *H01L 21/67109* (2013.01); *H01L 21/67248* (2013.01); *H01J 2237/334* (2013.01); *Y02P 70/50* (2015.11)

(58) Field of Classification Search
USPC .................. 118/728–733; 156/345.51–345.55
See application file for complete search history.

(56) References Cited

U.S. PATENT DOCUMENTS

| | | | |
|---|---|---|---|
| 4,173,924 A * | 11/1979 | Bradshaw | B05B 16/60 454/52 |
| 8,410,393 B2 | 4/2013 | Ricci et al. | |
| 2004/0068997 A1* | 4/2004 | Hirooka | F25B 25/005 62/175 |
| 2008/0314564 A1* | 12/2008 | Nagaseki | G05D 23/19 165/104.31 |
| 2009/0118872 A1* | 5/2009 | Nonaka | G05D 23/1934 700/285 |

(Continued)

FOREIGN PATENT DOCUMENTS

| | | |
|---|---|---|
| CN | 202598947 U | 12/2012 |
| JP | H05-243191 | 9/1993 |

(Continued)

*Primary Examiner* — Karla A Moore
*Assistant Examiner* — Tiffany Z Nuckols
(74) *Attorney, Agent, or Firm* — IPUSA, PLLC

(57) ABSTRACT

A temperature adjustment device includes a pedestal to receive a substrate thereon, a first temperature control unit to set a first medium at a first temperature, and a second temperature control unit to set a second medium at a second temperature that is higher than the first temperature. A pedestal flow passage is provided inside the pedestal to allow the first medium and the second medium to flow therethrough by switching between the first medium and the second medium. A first flow passage through which the first medium flowing from the pedestal flow passage is allowed to flow is provided. A second flow passage through which the second medium flowing from the pedestal flow passage is allowed to flow is provided. A heat pump is connected to the first flow passage and the second flow passage to transfer heat between the first medium and the second medium.

7 Claims, 10 Drawing Sheets

(56) References Cited

U.S. PATENT DOCUMENTS

| | | | | |
|---|---|---|---|---|
| 2012/0186745 | A1* | 7/2012 | Miya | H01J 37/32715 |
| | | | | 156/345.27 |
| 2013/0105081 | A1* | 5/2013 | Silveira | H01J 37/32724 |
| | | | | 156/345.27 |
| 2014/0262030 | A1* | 9/2014 | Buchberger, Jr. | ............................ |
| | | | | H01J 37/32724 |
| | | | | 156/345.27 |
| 2014/0262199 | A1* | 9/2014 | Kobayashi | G05D 23/1934 |
| | | | | 165/294 |

FOREIGN PATENT DOCUMENTS

| | | |
|---|---|---|
| JP | 2007-116098 | 5/2007 |
| JP | 2009-117443 | 5/2009 |

* cited by examiner

WHEN HEAT PUMP TURNED ON

WHEN HEAT PUMP TURNED ON

SWITCHING FROM HOT TO COLD

TEMPERATURE ADJUSTMENT DEVICE AND SUBSTRATE PROCESSING APPARATUS

CROSS-REFERENCE TO RELATED APPLICATIONS

This patent application is based upon and claims the benefit of priority of Japanese Patent Application No. 2015-186728, filed on Sep. 24, 2015, the entire contents of which are incorporated herein by reference.

BACKGROUND OF THE INVENTION

1. Field of the Invention

The present invention relates to a temperature adjustment device and a substrate processing apparatus.

2. Description of the Related Art

Techniques are known of providing a heating mechanism and a cooling mechanism to equalize temperature distribution of a substrate placed on a pedestal, as described in Japanese Laid-Open Patent Application Publication No. 5-243191, the U.S. Pat. No. 8,410,393, Japanese Laid-Open Patent Application Publication No. 2007-116098, and Japanese Laid-Open Patent Application Publication No. 2009-117443. For example, Japanese Laid-Open Patent Application Publication No. 5-243191 describes that a pedestal is divided into a plurality of portions each of which includes a cooling bath and that a temperature of a substrate placed on the pedestal is separately controlled at each of the portions. U.S. Pat. No. 8,410,393 describes a configuration of setting media inside four temperature adjustment units (chillers) at four different temperatures, and controlling flow rates of the media output from four of the temperature control units.

Japanese Laid-Open Patent Application Publication No. 2007-116098 describes that a phase change heat transfer loop including a flow passage provided inside an electrostatic chuck, includes an evaporator, a compressor, a condenser, and an expansion valve, and operates in either of a cooling mode or a heating mode.

Japanese Laid-Open Patent Application Publication No. 2009-117443 describes that a plurality of flow passages of different systems is provided inside a pedestal and that a temperature of a substrate is rapidly equalized by controlling flow rates of fluids having different temperature ranges.

In the meantime, each of the above patent documents describes the temperature adjustment system that includes the plurality of temperature adjustment units configured to set the media at different temperatures and adjust the target temperature by switching between the high temperature medium and the low temperature medium. In such temperature adjustment systems, sometimes, the high temperature medium returns to the low temperature adjustment unit and the low temperature medium returns to the high temperature adjustment unit when changing the target temperature.

In this manner, the temperatures inside the temperature adjustment units significantly change due to a heat load caused by the returning media with different temperatures from the controlled temperatures of the temperature adjustment units when circulating the high temperature medium and the low temperature medium by switching between the high temperature brine and the low temperature brine. Thus, productivity deteriorates because a long period of time is spent to set the medium of each of the temperature adjustment units at the controlled temperature, or the temperatures of the media do not reach the controlled temperatures in the end.

To solve the problems, increasing maximum amount of powers of heat sources included in the temperature adjustment units is considered to decrease the periods of time until the temperatures of the media reach the controlled temperatures. However, this method increases the amounts of power consumed by the temperature adjustment units, thereby increasing the cost of electricity.

Therefore, decreasing the above-mentioned heat loads by delaying timings of switching the valves in the temperature adjustment units when changing the temperature is considered. However, because a tank of the temperature adjustment unit on the high temperature side and a tank of the temperature adjustment unit on the low temperature side are coupled to each other, a heat transfer between the tanks occurs by adjustment of levels of liquid surfaces in the tanks. Thus, even if the timings of switching the valves in the temperature adjustment units are delayed, reducing the heat loads is difficult. Moreover, due to a heat shock caused by a mixture of the low temperature medium and the high temperature medium, durability of the temperature adjustment units deteriorates.

SUMMARY OF THE INVENTION

Accordingly, in response to the above discussed problems, embodiments of the present invention aim to provide a temperature adjustment device and a substrate processing apparatus that reduces a heat load caused by media controlled by two or more different temperature control units.

According to one embodiment of the present invention, there is provided a temperature adjustment device that includes a pedestal to receive a substrate thereon for processing, a first temperature control unit configured to control a temperature of a first temperature adjustment medium to a first temperature, and a second temperature control unit configured to control a temperature of a second temperature adjustment medium to a second temperature that is higher than the first temperature. A pedestal flow passage is provided inside the pedestal to allow the first temperature adjustment medium and the second temperature adjustment medium to flow therethrough by switching between the first temperature adjustment medium and the second temperature adjustment medium. A first flow passage through which the first temperature adjustment medium flowing out of the pedestal flow passage is allowed to flow is provided. A second flow passage through which the second temperature adjustment medium flowing out of the pedestal flow passage is allowed to flow is provided. A heat pump is connected to the first flow passage and the second flow passage and configured to transfer heat between the first temperature adjustment medium and the second temperature adjustment medium.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Figure 1:
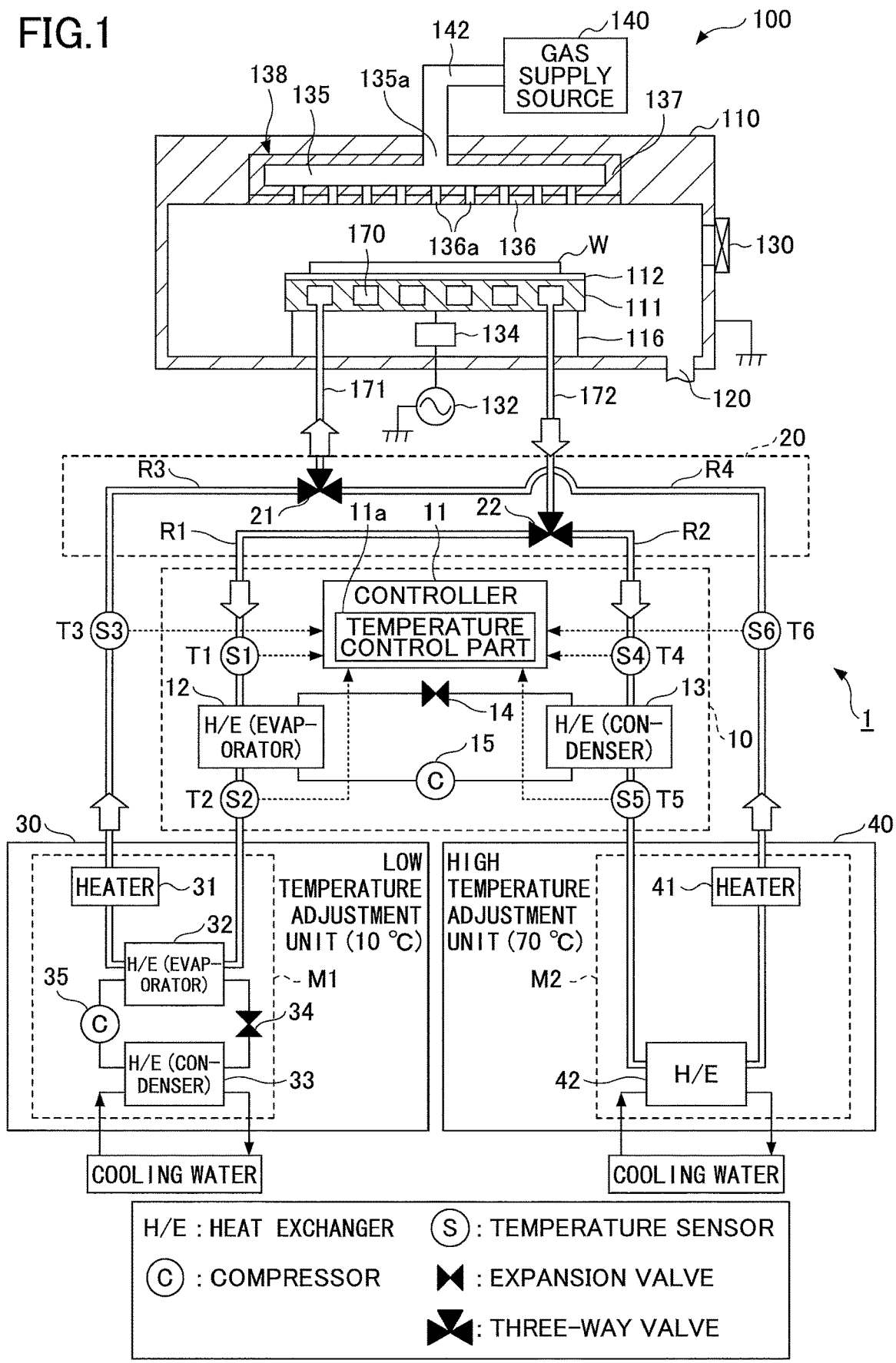
FIG. 1 illustrates an example of a temperature adjustment device according to an embodiment of the present invention.

Embodiments of the present invention are described below, with reference to accompanying drawings. Note that elements having substantially the same configuration may be given the same reference numerals and overlapping descriptions thereof may be omitted.

Overall Configuration of Temperature Adjustment Device

<Substrate Processing Apparatus>

To begin with, an example of a temperature adjustment device 1 according to an embodiment of the present invention is described below with reference to FIG. 1. In the present embodiment, a substrate processing apparatus 100 performs temperature control of a substrate by using the temperature adjustment device.

The substrate processing apparatus 100 illustrated in FIG. 1 is an example of an apparatus that processes a substrate, and includes a cylindrical process chamber 110 that is made of aluminum, stainless steel and the like, for example. The process chamber is grounded. The process chamber 110 includes a pedestal 111 therein that receives a semiconductor wafer W (which is hereinafter referred to as a "wafer W") thereon. The pedestal 111 is, for example, made of aluminum, and is supported by a cylindrical support 116 that vertically extends upward from a bottom of the process chamber 110. An electrostatic chuck 112 is provided on a top surface of the pedestal to hold a wafer W by an electrostatic attracting force. The electrostatic chuck 112 attracts and holds the wafer W thereon by Coulomb's force when a direct-current voltage is applied thereto. A wafer W is placed on the electrostatic chuck 112. In the present embodiment, a pedestal flow passage 170 is formed inside the pedestal 111. By causing low temperature brine and high temperature brine to flow through the pedestal flow passage 170 while switching between the high temperature brine and the low temperature brine, the temperature of the pedestal 111 is controlled, thereby setting the wafer W to a predetermined temperature.

An exhaust passage 120 is formed between a side wall of the process chamber 110 and the cylindrical support 116. The exhaust passage 120 is connected to an exhaust device (not shown in the drawings) such as a vacuum pump, which evacuates a process space in the process chamber 110 up to a predetermined degree of vacuum. A gate valve 13 that opens and closes a carry-in/out opening for transferring the wafer W is attached to the side wall of the process chamber 110.

A radio frequency power source 132 for plasma generation is connected to the pedestal 111 through a matching box 134. The radio frequency power source 132 supplies radio frequency power of, for example, 60 MHz to the pedestal 111. Thus, the pedestal 111 serves as a lower electrode. A shower head 138 described later is provided in a ceiling portion as an upper electrode held at ground potential. Thus, the radio frequency voltage from the radio frequency power source 132 is capacitively applied between the pedestal 111 and the shower head 138, which causes a discharge, thereby generating high-density plasma in the vicinity of a surface of the electrostatic chuck 112. A plasma process such as an etching process is performed on the wafer W set at a predetermined temperature due to an action of the generated plasma.

The shower head 138 in the ceiling portion includes an electrode plate 136 having many gas discharge holes and an electrode holder 137 that holds the electrode plate 136 detachably. A buffer chamber 135 is provided inside the electrode holder 137, and a gas supply source 140 is connected to a gas inlet 135a of the buffer chamber 135 through a gas supply pipe 142. Thus, a desired gas is supplied from the gas supply source 140 into the process chamber 110.

<Temperature Adjustment Device>

The temperature adjustment device 1 according to the present embodiment is connected to a low temperature adjustment unit 30 and a high temperature adjustment unit 40. Each of the low temperature adjustment unit 30 and the high temperature adjustment unit 40 includes a large tank that can store a fluid and a circulation pump, which makes it possible to cause an amount of the fluid stored in each tank to satisfy a predetermined amount that can always ensure stability of the temperature.

The low temperature adjustment unit 30 stores a first temperature adjustment medium (which is also hereinafter referred to as "low temperature brine") set at a first temperature by a heat exchanging part M1 provided in the low temperature adjustment unit 30 in the low temperature tank. The heat exchanging part M1 includes a heater 31, a heat exchanger H/E (evaporator 32), a heat exchanger H/E (condenser 33), an expansion valve 34 and a compressor 35. The low temperature adjustment unit 30 is an example of a first temperature control unit that controls the temperature of the first temperature adjustment medium so as to become a first temperature.

The high temperature adjustment unit 40 stores a second temperature adjustment medium (which is also hereinafter referred to as "high temperature brine") set at a second temperature that is higher than the first temperature by a heat exchanging part M2 provided in the high temperature adjustment unit 40 in the high temperature tank. The heat exchanging part M2 includes a heater 41, and a heat exchanger H/E 42. The high temperature adjustment unit 40 is an example of a second temperature control unit that controls the temperature of the second temperature adjustment medium so as to become the second temperature that is higher than the first temperature. The first temperature is controlled to become −30 degrees C. or higher, and the second temperature is controlled to become 70 degrees C. or lower. In the present embodiment, the first temperature is set at 10 degrees C., and the second temperature is set at 70 degrees C. Moreover, although a fluorine-based inert liquid is used as the low temperature brine and the high temperature brine in the present embodiment, another liquid may be used.

The low temperature brine output from the low temperature adjustment unit 30 flows through a flow passage R3, and the high temperature brine output from the high temperature adjustment unit 40 flows through a flow passage R4. A three-way valve 21 is provided at an intersection point of the flow passages R3 and R4 and an inlet flow passage 171. The three-way valve 21 causes either the low temperature brine flowing through the flow passage R3 or the high temperature brine flowing through the flow passage R4 to flow into the inlet flow passage 171 by switching between the high temperature brine and the low temperature brine.

A pedestal flow passage 170 is formed inside the pedestal 111. Either the low temperature brine or the high temperature brine flows into the pedestal flow passage 170 from the inlet flow passage 171 depending on the timing of a switch by the three-way valve 21, and flows toward an outlet flow passage 172. Thus, either the low temperature brine or the high temperature brine flows into the pedestal flow passage 170 by being switched by the three-way valve 21. This causes the pedestal flow passage 170 to operate in either a cooling mode or a heating mode. Although the pedestal flow passage 170 is formed as a flow passage formed inside the pedestal 111 in the present embodiment, the pedestal flow passage 170 is not limited to the present embodiment. For example, the pedestal flow passage 170 may be a flow passage formed inside the electrostatic chuck 112.

The pedestal flow passage 170 is provided in a circulation pathway to circulate the low temperature brine and the high temperature brine therethrough. A heat pump 10 and a switching unit 20 are provided in the circulation pathway. The circulation pathway is formed in the following order: the low temperature adjustment unit 30 and the high temperature adjustment unit 40→the flow passages R3 and R4→(the three-way valve 21)→the inlet flow passage 171→the pedestal flow passage 170→the outlet flow passage 172→(the three-way valve 22)→the flow passage R1 and R2→the heat pump 10→the low temperature adjustment unit 30 and the high temperature adjustment unit 40.

The low temperature brine and the high temperature brine flowing into the outlet flow passage 172 are returned to the low temperature adjustment unit 30 through the flow passage R1 or to the high temperature adjustment unit 40 through the flow passage R2 by being switched by the three-way valve 22. Here, the three-way valves 21 and 22 and parts of pipes forming the flow passages R1 through R4 constitute a switching unit. Thus, the temperature adjustment device 1 can adjust the temperature of the pedestal 111 and the wafer W by circulating the high temperature brine and the low temperature brine through the circulation pathway by switching between the high temperature brine and the low temperature brine.

However, the high temperature brine may flow into the flow passage R1 on the side of the low temperature adjustment unit 30 when the three-way valve 22 is switched. Similarly, the low temperature brine may flow into the flow passage R2 on the side of the high temperature adjustment unit 40 when switching the temperature. In this case, the temperatures of the brine inside the low temperature adjustment unit 30 and the high temperature adjustment unit 40 sometimes greatly change due to the heat load caused by the return of the high temperature brine to the low temperature adjustment unit 30 and the return of the low temperature brine to the high temperature adjustment unit 40. This lead to deterioration of the productivity because it takes a long time to set the temperature of the brine of each of the temperature adjustment units 30 and 40 to the controlled temperature, and to the inadequate temperature of the brine of each of the temperature adjustment units 30 and 40 that falls short of the controlled temperature.

Therefore, the temperature adjustment device 1 according to the present embodiment includes the heat pump 10. The heat pump 10 is connected to the flow passage R1 through which the low temperature brine returns to the low temperature adjustment unit 30 and the flow passage R2 through which the high temperature brine returns to the high temperature adjustment unit 40, and performs the heat transfer between the low temperature brine and the high temperature brine.

More specifically, the heat pump 10 includes an evaporator 12 in the flow passage R1 and a condenser 13 in the flow passage R2. The heat pump 10 includes the evaporator 12, the condenser 13, an expansion valve 14, a compressor 15 and pipes connecting them with each other.

The evaporator 12 is a heat exchanger that has a function of absorbing heat from outside and evaporating fluorocarbon. The condenser 13 is a heat exchanger having a function of condensing a fluorocarbon gas and releasing heat to the outside. The expansion valve 14 serves to rapidly expand fluorocarbon, thereby decreasing the temperature and the pressure of fluorocarbon. The compressor 15 serves to compress fluorocarbon, thereby increasing the temperature and the pressure of fluorocarbon.

In this manner, the evaporator 12 absorbs heat of fluorocarbon flowing through the flow passage R1, and fluorocarbon evaporates and is converted to a gas. The gas of fluorocarbon is drawn to the compressor 15, compressed into a gas of a high temperature and a high pressure, and is sent to the condenser 13. The gas of fluorocarbon is condensed into a liquid at the condenser 13 while releasing heat, and is returned to the evaporator 12 after the pressure thereof is reduced at the expansion valve 14.

When not using the heat pump 10, the maximum amount of power that can be output from the compressor 15 of the low temperature adjustment unit 30 needs to be increased in order to smoothly control the temperature of the low temperature brine. Moreover, a capacity of the heater 41 of the high temperature adjustment unit 40 needs to be increased in order to smoothly control the temperature of the high temperature brine. In this case, heat absorbed by the compressor 35 is released to coolant (e.g., cooling water), and is not utilized. Furthermore, when the maximum amount of power of the compressor 35 and the capacity of the heater 41 are increased, the cost of power increases.

In contrast, the temperature adjustment device 1 according to the present embodiment can transfer heat between the low temperature brine and the high temperature brine by using the heat pump 10 in the returning flow passages R1 and R2, in which the condenser 13 releases heat absorbed by the evaporator 12.

In addition, the heat pump 10 includes a controller 11. The controller 11 obtains temperatures T1, T2, T4 and T5 from temperature sensors S1 and S2 provided in the flow passage R1 and temperature sensors S4 and S5 provided in the flow passage R2, respectively. Moreover, the controller 11 obtains a temperature T3 from a temperature sensor S3 attached to the flow passage R3 and a temperature T6 from a temperature sensor S6 attached to the flow passage R4.

The controller 11 includes a temperature control par 11a. The temperature control part 11a is constituted of a processor and the like, and controls each part of the heat pump 10. More specifically, the temperature control part 11a adjusts the compressor 15 and the expansion valve 14 so as to maintain the temperature of the low temperature brine at 10 degrees C. Furthermore, the temperature control part 11a adjusts the compressor and the expansion valve 14 so as to maintain the temperature of the high temperature brine at 70 degrees C. As a result, the consumed power is reduced, and the temperatures of the low temperature brine and the high temperature brine can be smoothly controlled, thereby improving the productivity.

In this manner, the temperature adjustment device 1 according to the present embodiment releases heat absorbed by the evaporator 12, at the condenser 13 by using the heat pump 10 in the returning flow passages R1 and R2. Thus, heat can be efficiently transferred from the low temperature brine flowing through the flow passage R1 to the high temperature brine flowing through the flow passage R2. This makes it possible to transfer heat 3 to 7 times as much as the power consumed at the compressor 15 between the low temperature brine and the high temperature brine.

For example, an evaporation process, a pressing process, a condensing process, and an expansion process are performed in this order in the heat pump 10. Here, a heat amount absorbed into the brine that is a working medium in the evaporation process is assumed to be Q1. A heat amount released from the brine in the condensing process is assumed to be Q2. Input energy from the compressor 15 is assumed to be W. Under the preconditions, the following formula (1) is completed.

$$Q2=Q1+W \quad (1)$$

Here, a value obtained by the next formula (2) is defined as coefficient of performance (COP). A value of the COP of the heat pump 10 is always greater than 1.

$$COP=Q2/W=Q2/(Q2-Q1)=T2/(T2-T1) \quad (2)$$

Here, T1 is the temperature of the low temperature brine, and T2 is the temperature of the high temperature brine.

From the formula (2), it is noted that the COP is better as the difference in temperature between the low temperature brine and the high temperature brine is smaller. Because the work W is not converted to the heat amount but is used to transfer heat, the COP is invariably greater than 1, usually about 3 to 7, and possibly greater than or equal to 10. As discussed above, according to the present embodiment, it is possible to transfer heat 3 to 7 times as much as the power consumed by the compressor 15 between the low temperature brine and the high temperature brine.

Operation of Heat Pump and Brine Temperature

Next, an example of specific operation of the heat pump 10 and the brine temperature is described below with reference to FIGS. 2 through 9B. When the temperature of the pedestal 111 is stably maintained at 10 degrees C., the low temperature brine flows through the circulation pathway composed of the flow passage R3, the inlet flow passage 171, the pedestal flow passage 170, the outlet flow passage 172 and the flow passage R1 via the low temperature adjustment unit 30 in FIG. 1 as a premise. The circulation pathway is formed as a closed loop by the three-way valves 21 and 22 while the high temperature brine is present in the flow passages R2 and R4.

When switching the temperature of the pedestal 111 from 10 degrees C. to 70 degrees C., the open and close of the three-way valves 21 and 22 of the switching unit 20 is controlled. By this control, the high temperature brine flows through the circulation pathway composed of the flow passage R4, the inlet flow passage 171, the pedestal flow passage 170, the outlet flow passage 172 and the flow passage R2 via the high temperature adjustment unit 40. On this occasion, the circulation pathway is formed as a closed loop while the low temperature brine is present in the flow passages R1 and R3.

Furthermore, when switching the temperature of the pedestal 111 from 70 degrees C. to 10 degrees C., the open and close of the three-way valves 21 and 22 of the switching unit 20 is controlled. By this control, the low temperature brine flows through the circulation pathway composed of the flow passage R3, the inlet flow passage 171, the pedestal flow passage 170, the outlet flow passage 172 and the flow passage R1 via the low temperature adjustment unit 30 again. On this occasion, the circulation pathway is formed as the closed loop while the high temperature brine is present in the flow passages R2 and R4.

<Brine Temperature when not Using Heat Pump>

Figure 2:
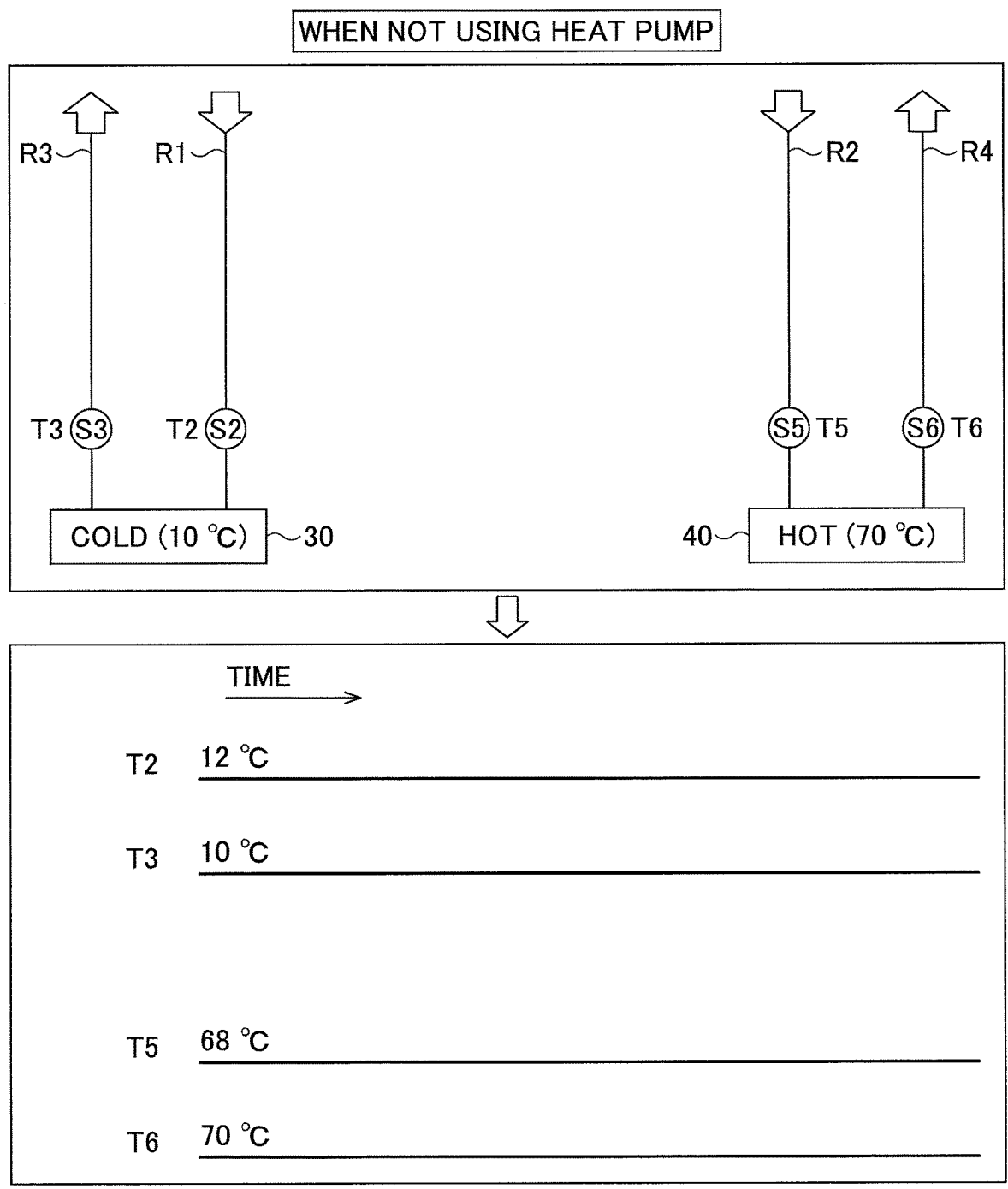
FIG. 2 illustrates an example of a change in temperature when a heat pump is not used according to an embodiment of the present invention.

To begin with, the temperatures of the low temperature brine and the high temperature brine when not using the heat pump 10 of the present embodiment are described below. FIG. 2 illustrates and example of detected values of the temperature sensors when not using the heat pump 10 of the present embodiment. The temperature sensor S3 detects the temperature T3 of the low temperature brine output from the low temperature adjustment unit 30 and flowing through the going flow passage R3. The low temperature adjustment unit 30 controls the low temperature brine so as to be kept at 10 degrees C. The temperature sensor S2 detects the temperature T2 of the low temperature brine flowing through the returning flow passage R1 to the low temperature adjustment unit 30.

The temperature sensor S6 detects the temperature T6 of the high temperature brine output from the high temperature adjustment unit 40 and flowing through the going flow passage R4. The high temperature adjustment unit 40 controls the high temperature brine so as to be kept at 70 degrees C. The temperature sensor S5 detects the temperature T5 of the high temperature brine flowing through the returning flow passage R2 to the high temperature adjustment unit 40.

When not using the heat pump, as illustrated at a lower diagram in FIG. 2, the temperature T3 indicates that the temperature of the low temperature brine is held at 10 degrees C. that is controlled by the low temperature adjustment unit 30, and the temperature T6 indicates that the temperature of the high temperature brine is held at 70 degrees C. that is controlled by the high temperature adjustment unit 40.

In contrast, after flowing through the pedestal flow passage 170, the temperature T2 of the low temperature brine flowing through the returning flow passage R1 to the low temperature adjustment unit 30 indicates 12 degrees C. This means that the temperature of the low temperature brine returned to the low temperature adjustment unit 30 rises up to a temperature that is higher than controlled temperature by 2 degrees C. because a part of the high temperature brine flows into the returning flow passage R1 to the low temperature adjustment unit 30.

Similarly, after flowing through the pedestal flow passage 170, the temperature T5 of the high temperature brine flowing through the returning flow passage R2 to the high temperature adjustment unit 40 indicates 68 degrees C. This means that the temperature of the high temperature brine returned to the high temperature adjustment unit 40 decreases to a temperature that is lower than controlled temperature by 2 degrees C. because a part of the low temperature brine flows into the returning flow passage R2 to the high temperature adjustment unit 40.

<Brine Temperature when Using Heat Pump>

Figure 3:
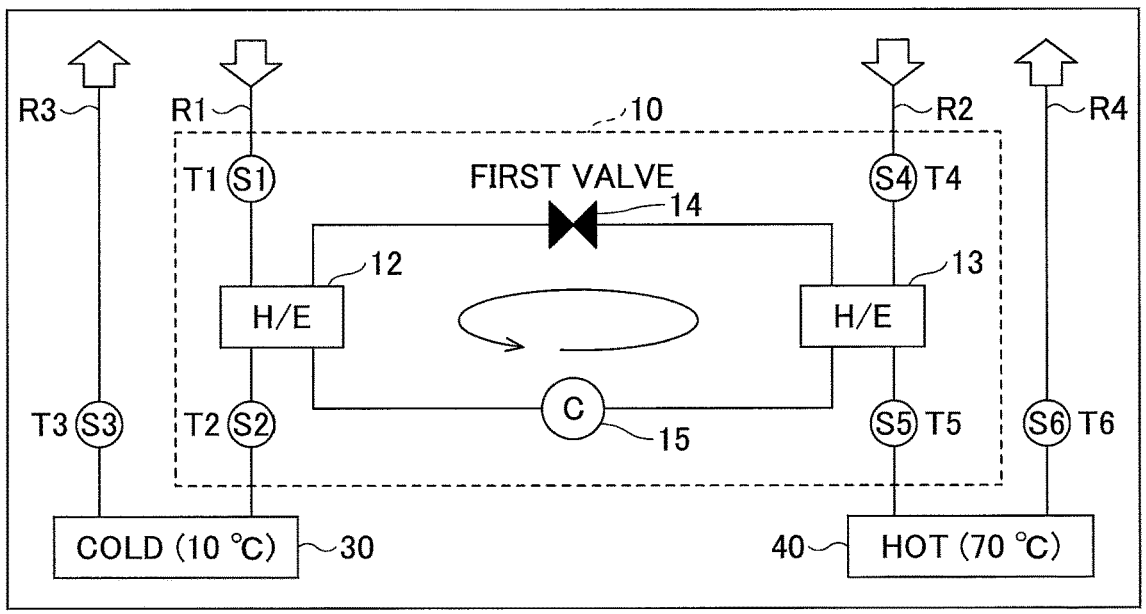
FIG. 3 illustrates an example of a change in temperature when a heat pump is used according to an embodiment of the present invention.
Figure 3:
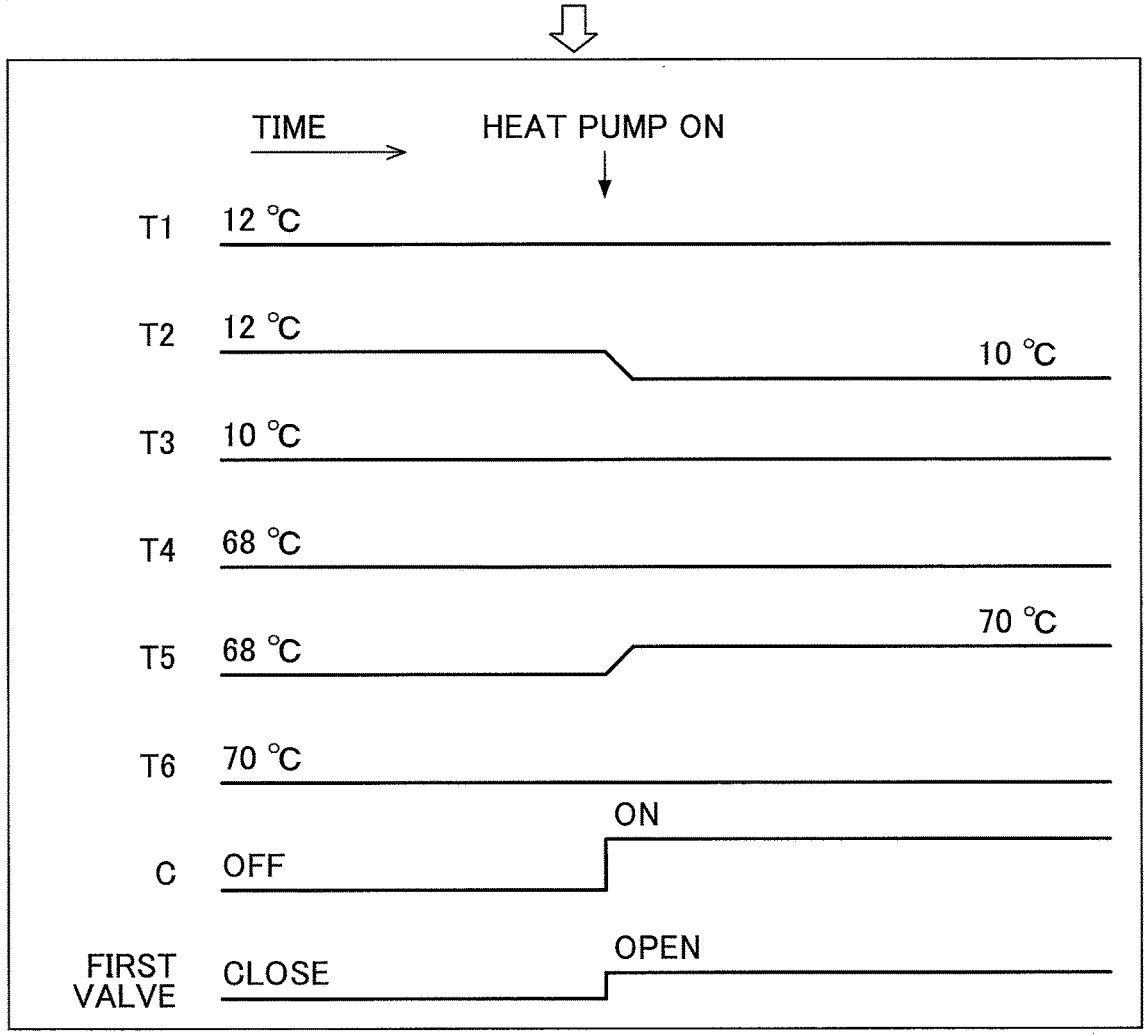

Next, the temperatures of the low temperature brine and the high temperature brine when using the heat pump 10 according to the present embodiment are described below. FIG. 3 illustrates an example of detected values of the temperature sensors when using the heat pump 10 according to the present embodiment. The temperatures of the temperature sensors S2, S3, S5 and S6 are held at the temperatures illustrated in FIG. 2 until the heat pump 10 is turned on (operated). In addition, the temperatures T1 and T2 detected by the temperature sensors S1 and S2 provided upstream and downstream of the evaporator 12 in the returning flow passage R1 are held at the same temperature until the heat pump 10 is turned on (operated). Similarly, the temperatures T4 and T5 detected by the temperature sensors S4 and S5 provided upstream and downstream of the condenser 13 in the returning flow passage R2 are held at the same temperature until the heat pump 10 is turned on.

When the heat pump 10 is turned on, the compressor 15 is turned on (operated), and a first valve (the expansion valve 14) is opened. At this time, the low temperature brine flowing through the flow passage R1 absorbs heat, evaporates and converts to a gas at the evaporator 12. The gas is drawn to the compressor 15, compressed to a gas of a high temperature and a high pressure, and is sent to the condenser 13. The low temperature brine release heat, converts to a liquid, and returns to the evaporator 12 after the pressure is reduced by the expansion valve 14.

By doing this, the temperature of the low temperature brine from which heat is absorbed at the evaporator 12 decreases to 10 degrees C. as the detected value of the temperature sensor S2 indicates. Thus, the low temperature brine of 10 degrees C. returns to the low temperature adjustment unit 30. This makes it possible to smoothly perform the temperature control of the low temperature brine in the low temperature adjustment unit 30.

The low temperature brine converted to the gas at the evaporator 12 is compressed into the gas of the high temperature and the high pressure, releases heat and converts to the liquid at the condenser 13. Released heat raises the temperature of the high temperature brine flowing through the returning flow passage R2. Thus, the temperature T5 of the high temperature brine flowing through the flow passage R2 rises up to 70 degrees C. as the detected value of the temperature sensor S5 indicates. In this manner, the high temperature brine of 70 degrees C. returns to the high temperature adjustment unit 40. This makes it possible to smoothly perform the temperature control of the high temperature brine in the high temperature adjustment unit 40.

<Brine Temperature During Switch from Low Temperature to High Temperature>

Figure 4:
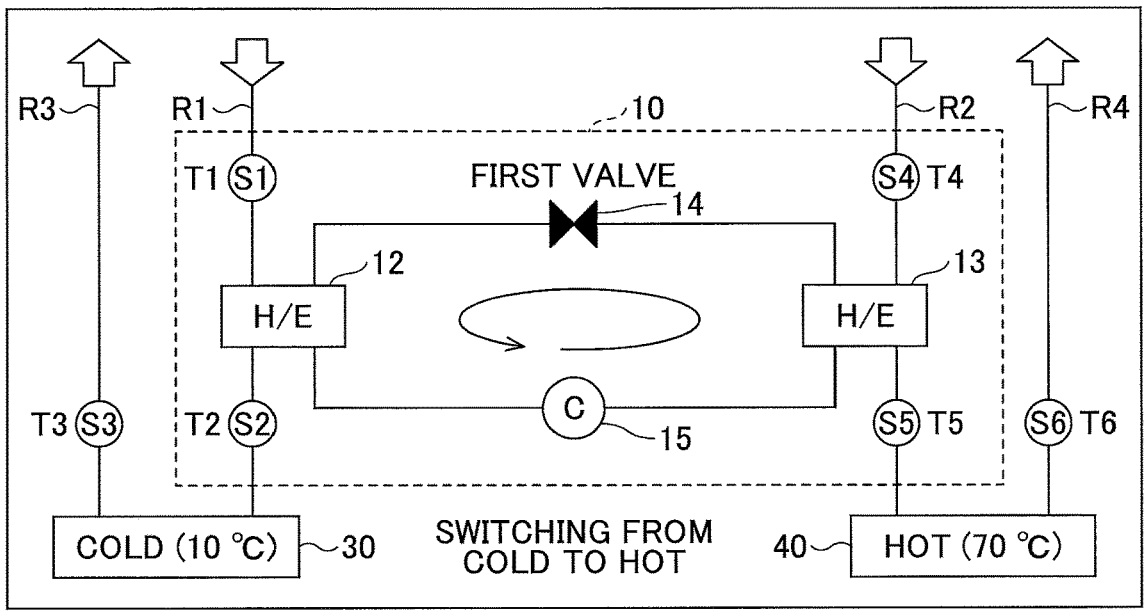
FIG. 4 illustrates an example of a change in temperature when a heat pump is turned off (switching from a low temperature to a high temperature) according to an embodiment of the present invention.
Figure 4:
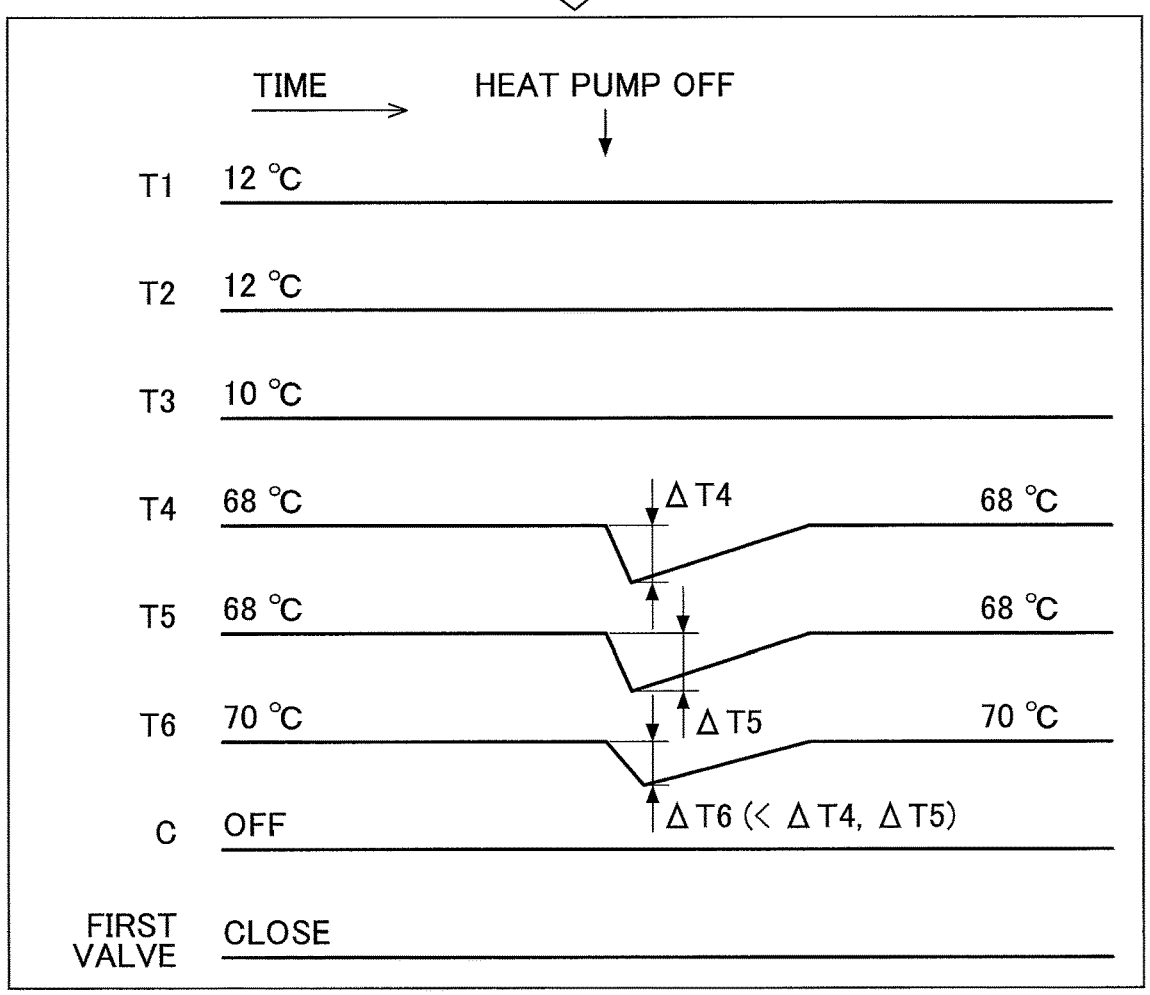
Figure 5:
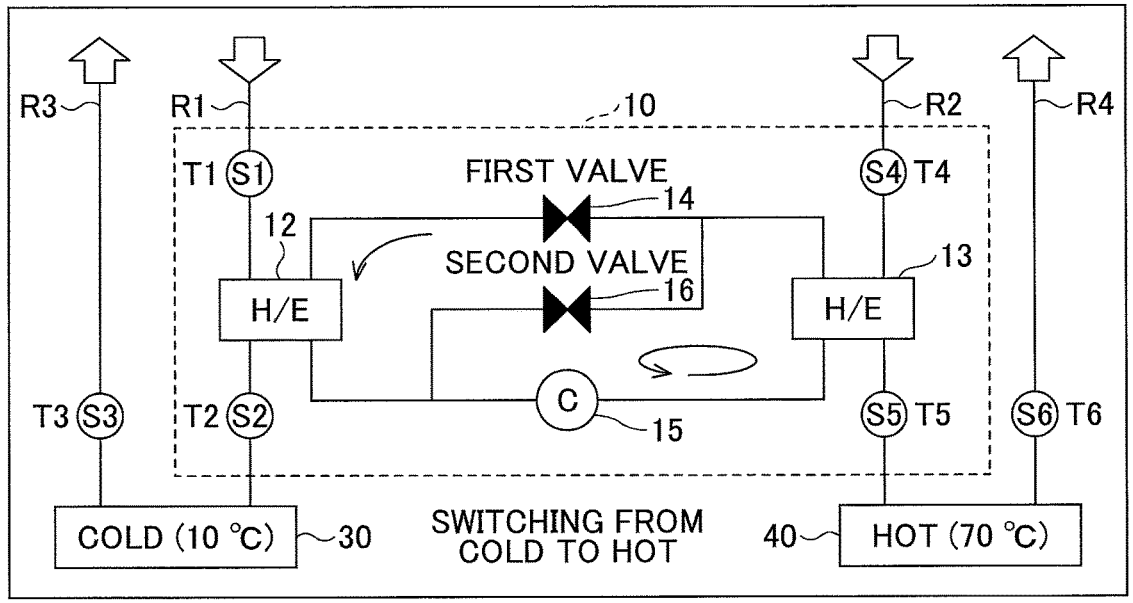
FIG. 5 illustrates an example of a change in temperature when a heat pump is turned on (switching from a low temperature to a high temperature) according to an embodiment of the present invention.
Figure 5:
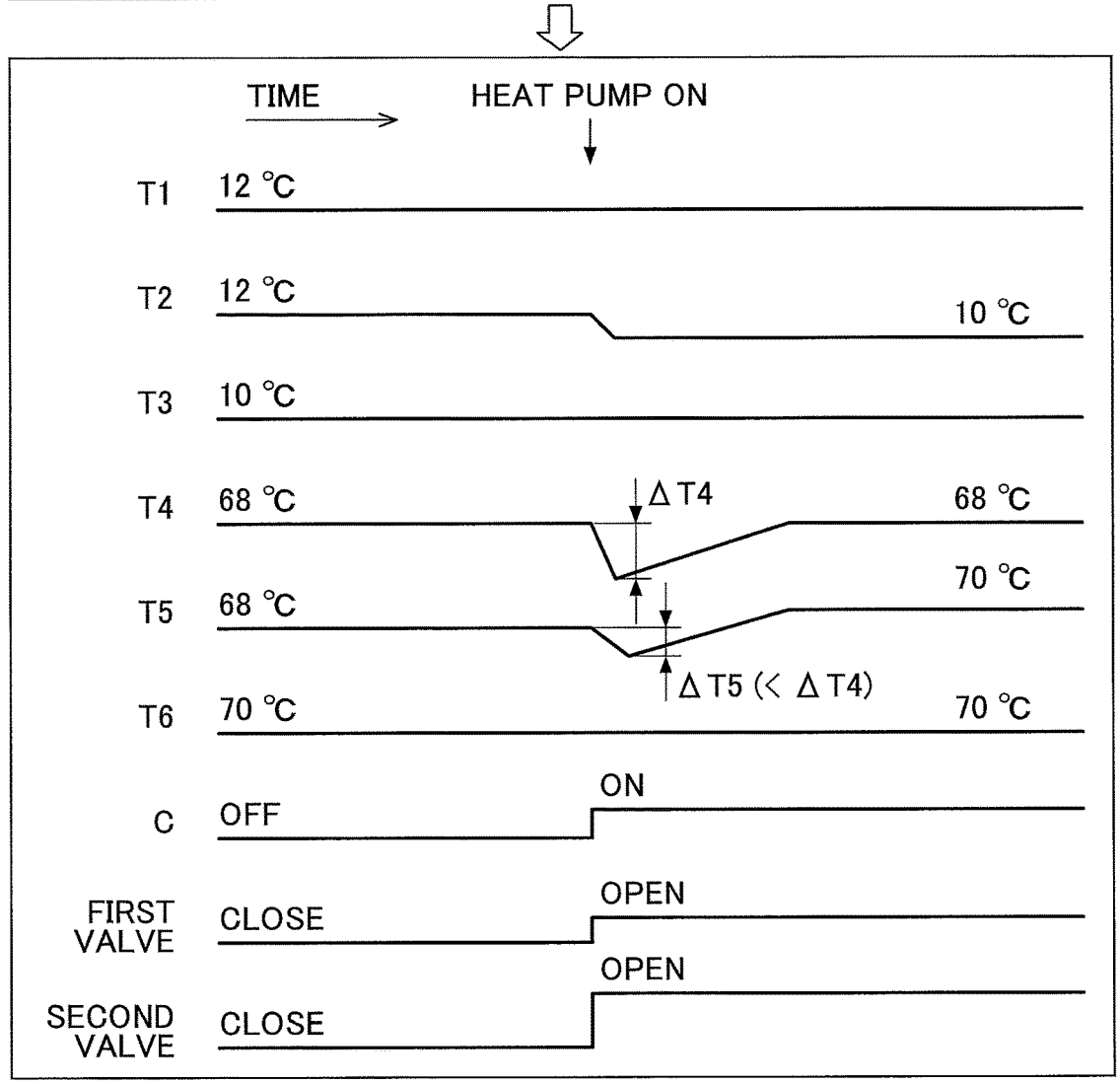

Next, the temperatures of the low temperature brine and the high temperature brine when switching the temperature of the pedestal 111 from a low temperature to a high temperature are described below while comparing the case of turning off the heat pump 10 with the case of turning on the heat pump 10 according to the present embodiment. FIG. 4 illustrates an example of temperatures during a switch from a low temperature to a high temperature when turning off the heat pump 10 according to the present embodiment. FIG. 5 illustrates an example of temperatures during a switch from a low temperature to a high temperature when turning on the heat pump 10.

To begin with, with reference to FIGS. 1 and 4, when switching the brine flowing through the inlet flow passage 171 from the low temperature brine of 10 degrees C. to the high temperature brine of 70 degrees C. by switching the three-way valves 21 and 22 of the switching unit 20, a part of the low temperature brine flows into the flow passages R2 and R4 through which the high temperature brine flows. When the heat pump 10 is turned off, the temperatures T4 and T5 of the high temperature brine flowing through the flow passage R2 decrease by amounts of decrease of $\Delta T4$ and $\Delta T5$ at first, and then gradually returns to the original temperature of 68 degrees C. Moreover, the temperature T6 of the high temperature brine flowing through the flow passage R4 decreases by an amount of decrease of $\Delta T6$ at first, and then gradually returns to the original temperature of 70 degrees C. At this time, the high temperature adjustment unit 40 is going to maintain the high temperature brine at 70 degrees C. Due to the effect of the temperature control, the amount of decrease of $\Delta T6$ by switching the temperature T6 of the high temperature brine output from the high temperature adjustment unit 40 and flowing through the flow passage R4 is smaller than the amounts of decrease $\Delta T4$ and $\Delta T5$ by switching the temperatures T4 and T5 of the high temperature brine flowing through the flow passage R2. In short, the amounts of decrease are as follows: $\Delta T6 < \Delta T4$; and $\Delta T6 < \Delta T5$. Here, when switching from the low temperature brine of 10 degrees C. to the high temperature brine of 70 degrees C., the temperatures T1 through T3 of the low temperature brine flowing through the flow passages R1 and R3 do not change.

Subsequently, as illustrated in FIG. 5, the temperatures of the low temperature brine and the high temperature brine during a switch from a low temperature to a high temperature when turning on the heat pump 10 are described below. During the switch, a part of the low temperature brine flows into the flow passages R2 and R4 through which the high temperature brine flows.

However, in FIG. 5, because the heat pump 10 is turned on, an amount of decrease of $\Delta T5$ of the temperature T5 of the high temperature brine flowing through the flow passage R2 after receiving or releasing heat at the heat exchanger 13 of the heat pump 10 is smaller than an amount of decrease $\Delta T4$ in the temperature T4 of the high temperature brine flowing through the flow passage R2, and gradually returns to the original temperature. In other words, when the heat pump 10 is turned on, the compressor 15 is turned on, and the expansion valve 14 (which is also hereinafter referred to as a "first valve 14") and the expansion valve 16 (which is also hereinafter referred to as a "second valve 16") are opened. Heat of the low temperature brine flowing through the flow passage R1 is absorbed by the evaporator 12, where the low temperature brine evaporates and converts to a gas. The gas is drawn to the compressor 15, compressed to a gas of a high temperature and a high pressure, and sent to the condenser 13. The gas of the high temperature and the high pressure releases heat and converts to a liquid at the condenser 13, and a part of the liquid returns to the evaporator 12 and the other part of the liquid returns to the compressor 15 after the pressure of the liquid is reduced by the first valve 14 and the second valve 16.

In this manner, the amount of decrease $\Delta T5$ in the temperature T5 is smaller than the case of turning off the heat pump 10 in FIG. 4. Thus, the heat load applied to the high temperature adjustment unit 40 decreases, and the temperature T6 of the high temperature brine output from the high temperature adjustment unit 40 is maintained at 70 degrees C. As discussed above, the temperature adjustment device 1 including the heat pump 10 according to the present embodiment can reduce the heat load caused by the brine returned to the high temperature adjustment unit 40 by heating the high temperature brine due to the heat transfer between the high temperature brine and the low temperature brine.

<Brine Temperature During Switch from High Temperature to Low Temperature>

Figure 6:
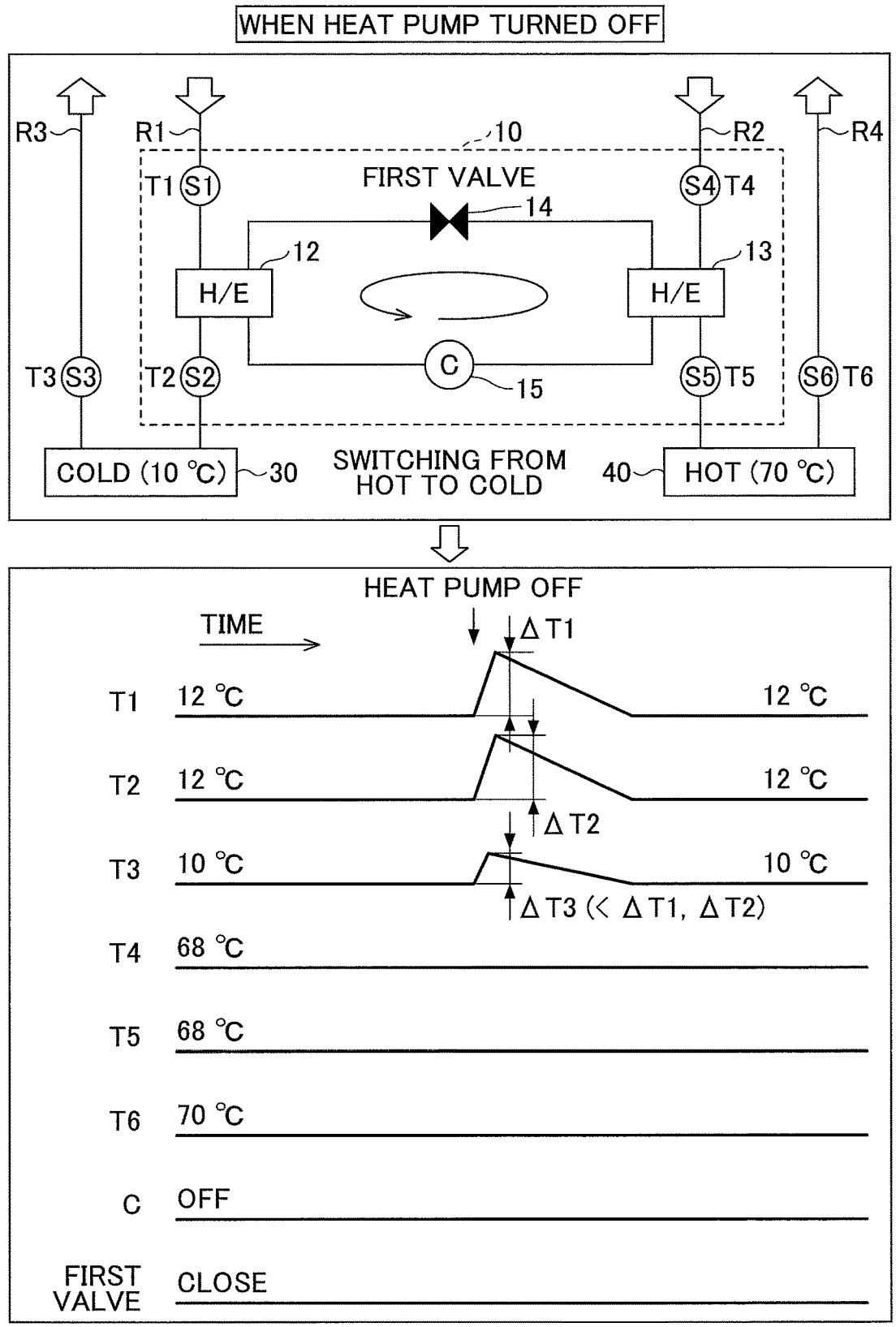
FIG. 6 illustrates an example of a change in temperature when a heat pump is turned off (switching from a high temperature to a low temperature) according to an embodiment of the present invention.
Figure 7:
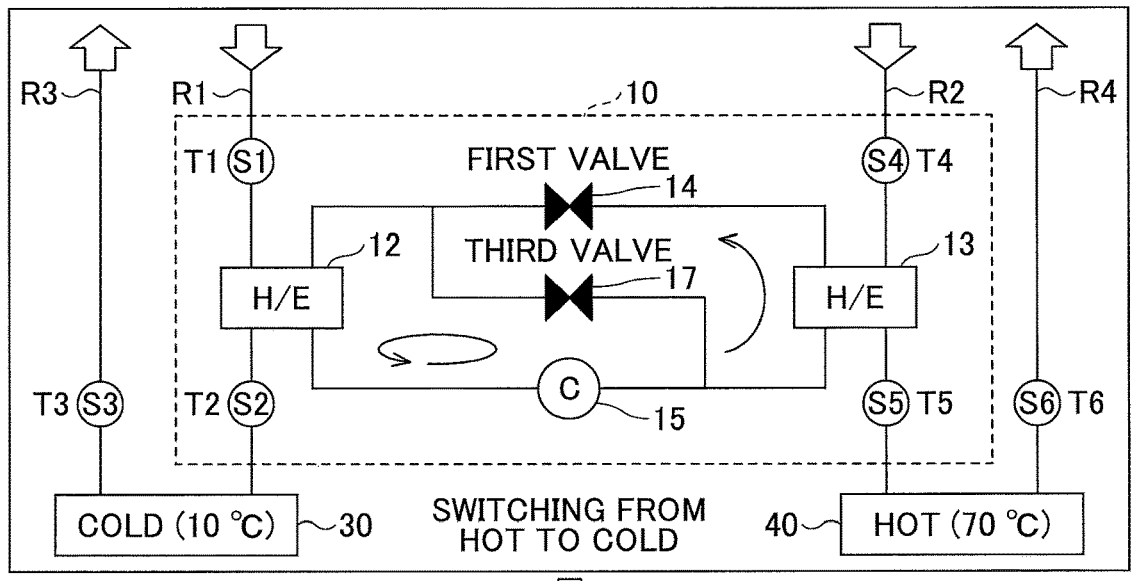
FIG. 7 illustrates an example of a change in temperature when a heat pump is turned on (switching from a high temperature to a low temperature) according to an embodiment of the present invention.
Figure 7:
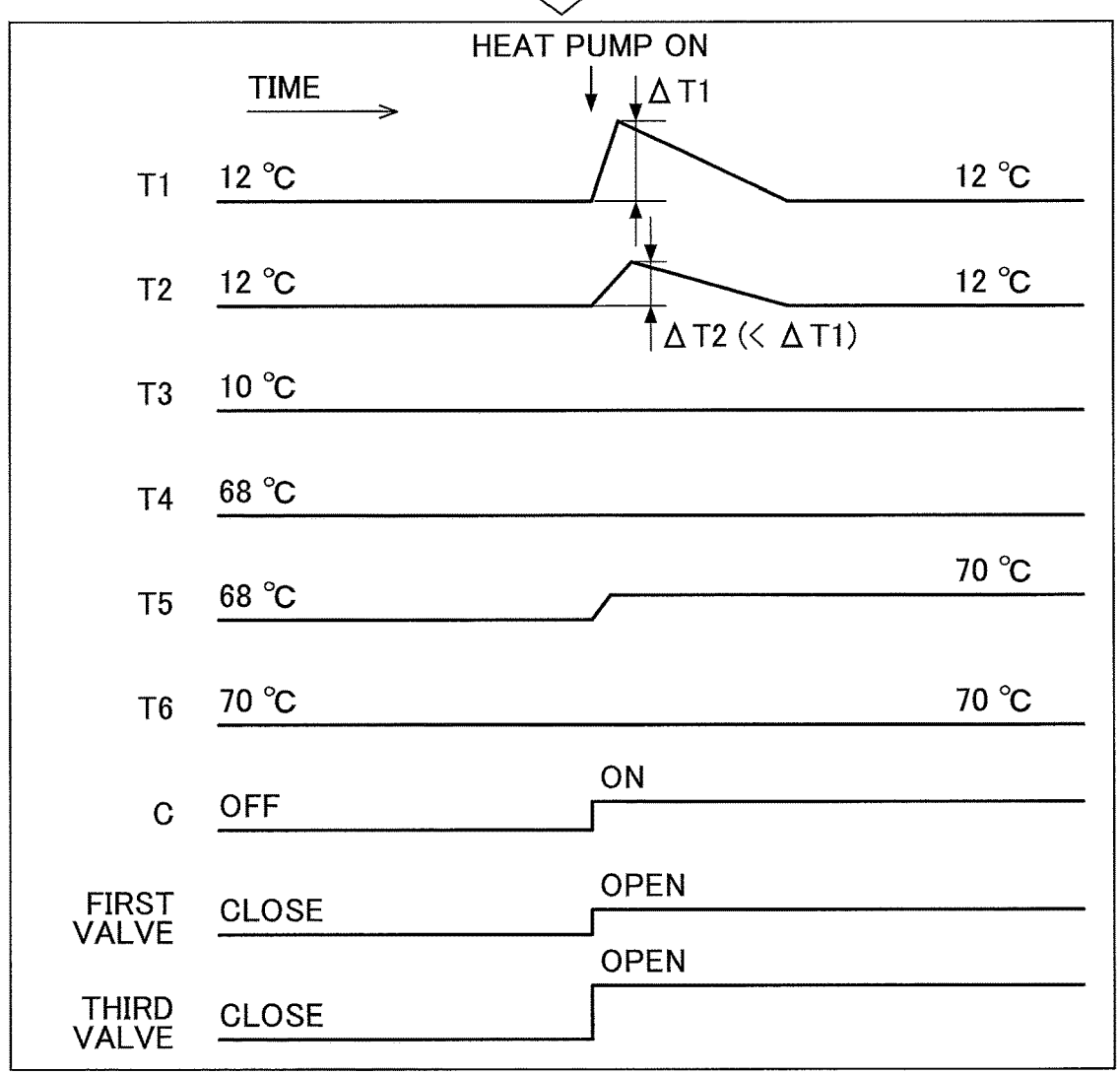

Next, the temperatures of the low temperature brine and the high temperature brine when switching the temperature of the pedestal 111 from a high temperature to a low temperature are described below while comparing the case of turning off the heat pump 10 with the case of turning on the heat pump 10 according to the present embodiment. FIG. 4 illustrates an example of temperatures during a switch from a low temperature to a high temperature when turning off the heat pump 10 according to the present embodiment. FIG. 6 illustrates an example of temperatures during a switch from a high temperature to a low temperature when turning off the heat pump 10. FIG. 7 illustrates an example of temperatures during a switch from a high temperature to a low temperature when turning on the heat pump 10.

To begin with, with reference to FIGS. 1 and 6, when switching the brine flowing through the inlet flow passage 171 from the high temperature brine of 70 degrees C. to the low temperature brine of 10 degrees C. by switching the three-way valves 21 and 22 of the switching unit 20, a part of the high temperature brine flows into the flow passages R1 and R3 through which the low temperature brine flows. When the heat pump 10 is turned off, the temperatures T1 and T2 of the high temperature brine flowing through the flow passage R1 increase by amounts of increase of $\Delta T1$ and $\Delta T2$ at first, and then gradually returns to the original temperature of 12 degrees C. Moreover, the temperature T3 of the low temperature brine flowing through the flow passage R3 decreases by an amount of increase of $\Delta T3$ at first, and then gradually returns to the original temperature of 10 degrees C. At this time, the low temperature adjustment unit 30 is going to maintain the low temperature brine at 10 degrees C. Due to the effect of the temperature control, the amount of increase of $\Delta T3$ by switching the temperature T3 of the low temperature brine output from the low temperature adjustment unit 30 and flowing through the flow passage R3 is smaller than the amounts of increase $\Delta T1$ and $\Delta T2$ by switching the temperatures T1 and T2 of the low temperature brine flowing through the flow passage R1. In short, the amounts of decrease are as follows: $\Delta T3<\Delta T1$; and $\Delta T3<\Delta T2$. Here, when switching from the high temperature brine of 70 degrees C. to the low temperature brine of 10 degrees C., the temperatures T4 through T6 of the low temperature brine flowing through the flow passages R2 and R4 do not change.

Subsequently, as illustrated in FIG. 7, the temperatures of the low temperature brine and the high temperature brine during a switch from a high temperature to a low temperature when turning on the heat pump 10 are described below. During the switch, a part of the high temperature brine flows into the flow passages R1 and R3 through which the low temperature brine flows.

However, in FIG. 7, because the heat pump 10 is turned on, an amount of increase of $\Delta T2$ of the temperature T2 of the low temperature brine flowing through the flow passage R1 after receiving or releasing heat at the heat exchanger 12 of the heat pump 10 is smaller than an amount of increase $\Delta T1$ in the temperature T1, and gradually returns to the original temperature. In other words, when the heat pump 10 is turned on, the compressor 15 is turned on, and the first valve 14 and the third valve 17 that are the expansion valve are opened. Heat of the low temperature brine flowing through the flow passage R1 is absorbed by the evaporator 12, where the low temperature brine evaporates and converts to a gas. The gas is drawn to the compressor 15, compressed to a gas of a high temperature and a high pressure, and sent to the condenser 13. The gas of the high temperature and the high pressure releases heat and converts to a liquid at the condenser 13, and a part of the liquid returns to the evaporator 12 and the other part of the liquid returns to the compressor 15 after the pressure of the liquid is reduced by the first valve 14 and the third valve 17.

In this manner, the amount of increase $\Delta T2$ in the temperature T2 is smaller than the case of turning off the heat pump 10 in FIG. 6. Thus, the heat load applied to the low temperature adjustment unit 30 decreases, and the temperature T3 of the low temperature brine output from the low temperature adjustment unit 30 is maintained at 10 degrees C. As discussed above, the temperature adjustment device 1 including the heat pump 10 according to the present embodiment can reduce the heat load caused by the brine returned to the high temperature adjustment unit 40 by cooling the low temperature brine due to the heat transfer between the high temperature brine and the low temperature brine.

Use of Coolant

In some cases, even the above-mentioned heat pump 10 could run short of heating capability of the high temperature brine during the switch from the low temperature to the high temperature and cooling capacity of the low temperature brine during the switching from the high temperature to the low temperature. In this case, the heat load caused by the brine returning to the low temperature adjustment unit 30 and the high temperature adjustment unit 40 can be further reduced by exchanging heat between the heat pump 10 and coolant (e.g., tap water).

Figure 8A:
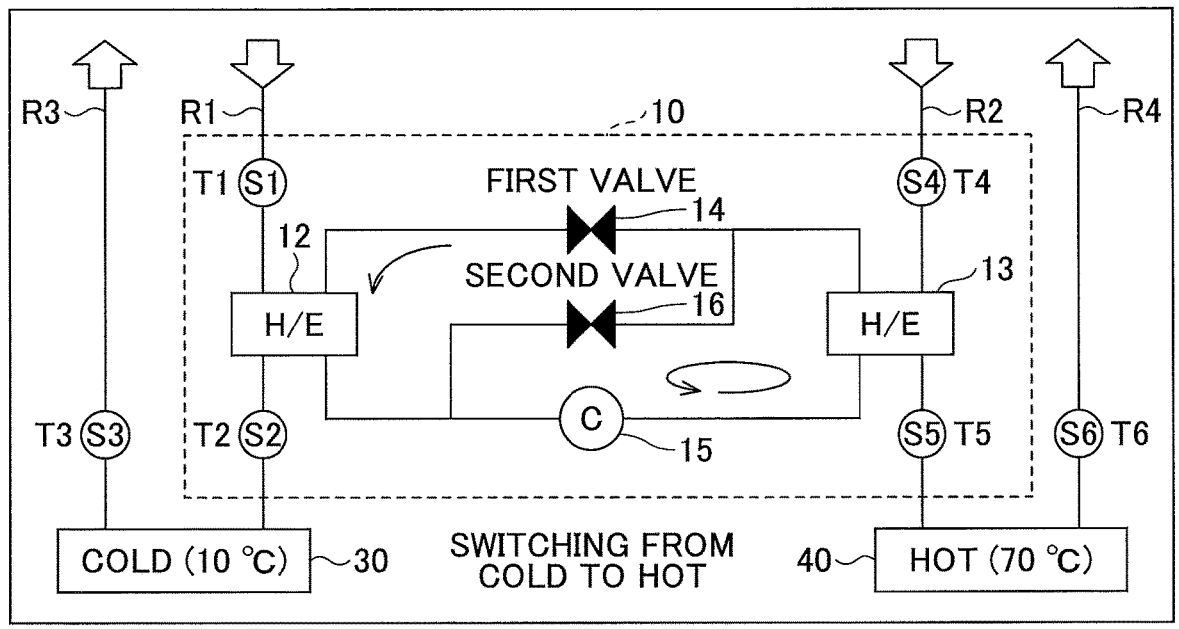
FIGS. 8A and 8E illustrate examples of cooling water and heat exchange when turning a heat pump is turned on (switching from a low temperature to a high temperature) according to an embodiment of the present invention.

In the heat pump 10 illustrated in FIG. 8A, the high temperature brine is heated by the heat transfer between the high temperature brine and the low temperature brine during the switch from the low temperature to the high temperature. On this occasion, when the high temperature brine is inadequately heated, the amount of decrease $\Delta T5$ in the temperature T5 of FIG. 5 increases, and the heat load caused by the brine returning to the high temperature adjustment unit 40 cannot be adequately reduced.

Figure 8B:
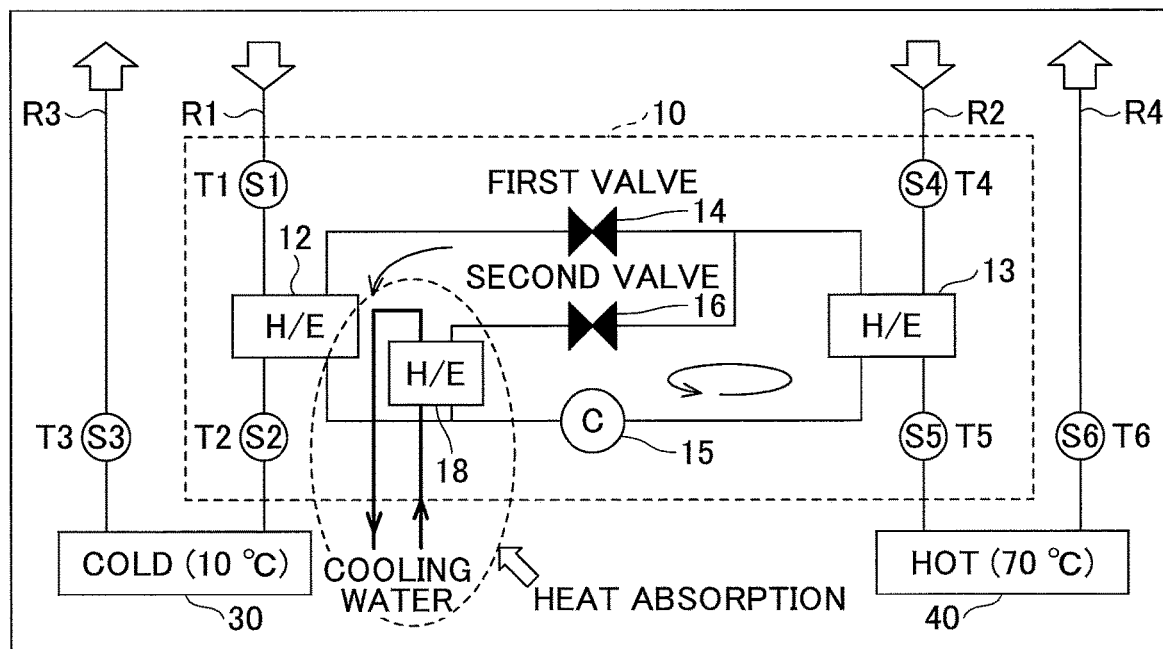

In this case, in the heat pump 10 illustrated in FIG. 8B, an additional evaporator 18 is provided in series with the second valve 16. The evaporator 18 is connected in parallel with the evaporator 12 and absorbs heat from coolant (heat absorption).

A gas converted from the liquid at the evaporators 12 and 18 is drawn to the compressor 15, and the compressed gas is sent to the condenser 13. The gas is converted to a liquid by releasing heat at the condenser, and is sent to the evaporator 12 or the evaporator 18 after the pressure of the liquid is reduced by the first valve 14 and the second valve 16.

As described above, the heat pump 10 illustrated in FIG. 8B according to an embodiment can enhance the heating capacity by absorbing heat from coolant by the heat exchanger 18 and further can reduce the heat load caused by the brine returning to the high temperature adjustment unit 40.

Figure 9A:
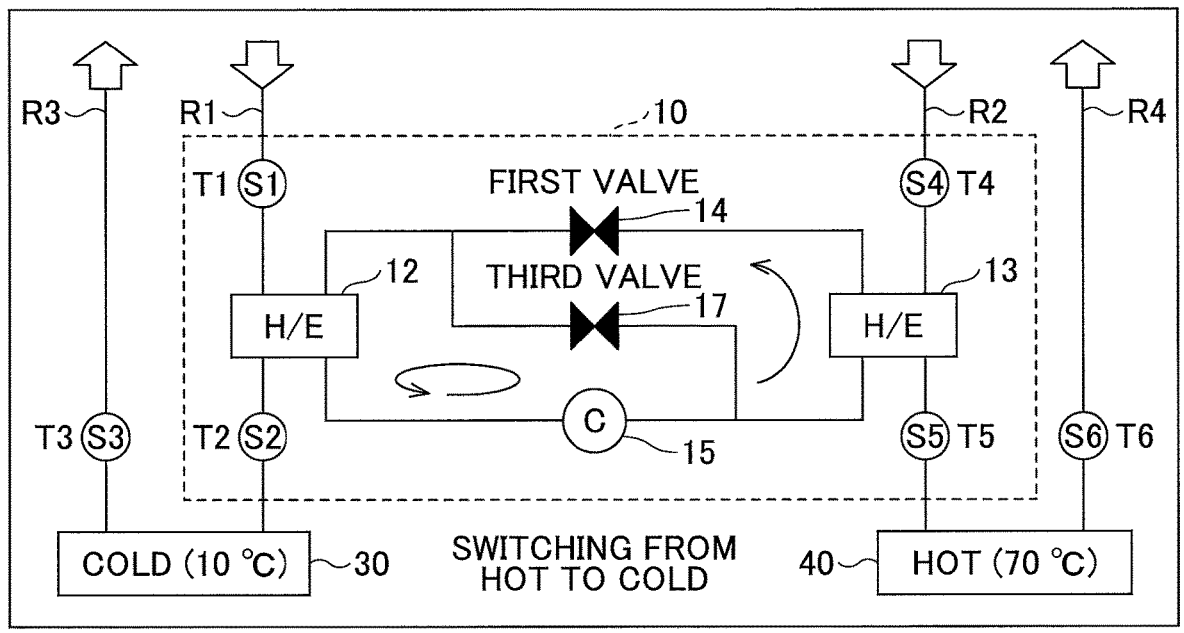
FIGS. 9A and 9B illustrate examples of coolant and heat exchange when a heat pump is turned on (switching from a high temperature to a low temperature) according to an embodiment of the present invention.
Figure 9B:
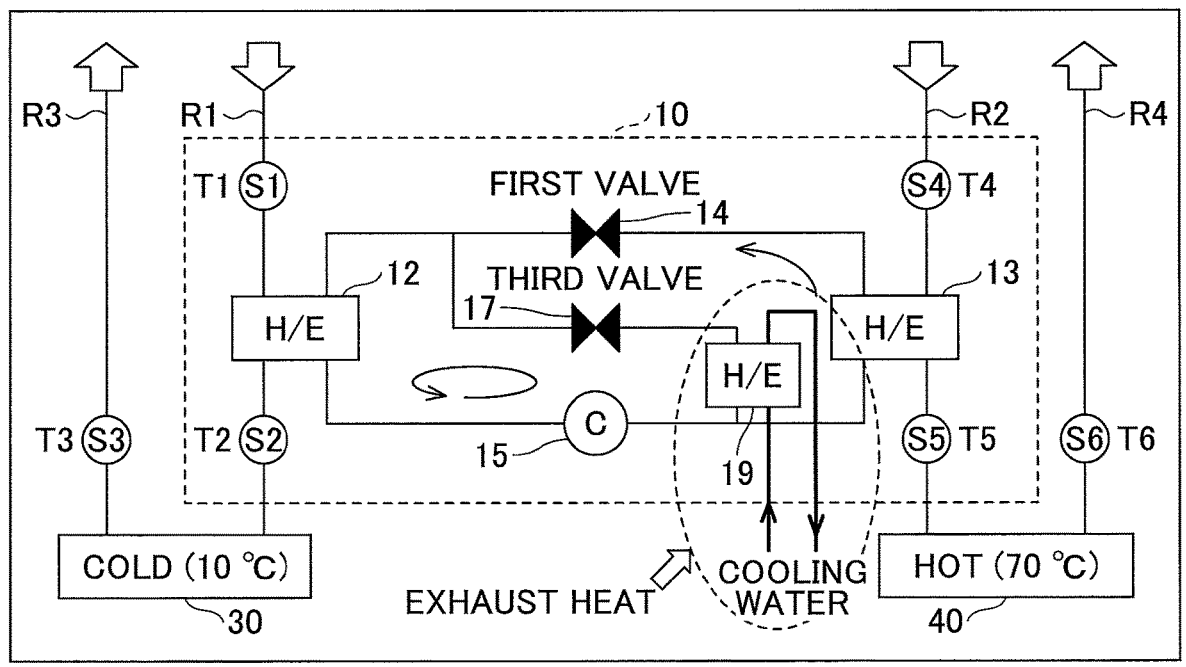

Similarly, in the heat pump 10 illustrated in FIG. 9A, during the switch from the high temperature to the low temperature, the low temperature brain is cooled by the heat transfer between the high temperature brine and the low temperature brine. On this occasion, if the low temperature brine is inadequately cooled, the amount of increase ΔT2 in the temperature T2 in FIG. 7 increases, and the heat load caused by the brine returning to the low temperature adjustment unit 30 cannot be adequately cooled.

In this case, in the heat pump 10 illustrated in FIG. 9A, an additional condenser 19 is provided in series with the third valve 17. The condenser 19 is connected in parallel with the condenser 13, and releases heat to coolant (exhaust heat).

The gas of the high temperature and the high pressure sent to the condensers 13 and 19 converts to a liquid, and is sent to the evaporator 12 or the condenser 19 after the pressure of the liquid is reduced by the first valve 14 and the third valve 17.

As described above, the heat pump 10 illustrated in FIG. 9B according to the embodiment can enhance the cooling capacity by releasing heat to coolant via the heat exchanger 19 and further can reduce the heat load caused by the brine returning to the low temperature adjustment unit 30.

Modified Embodiment

Figure 10:
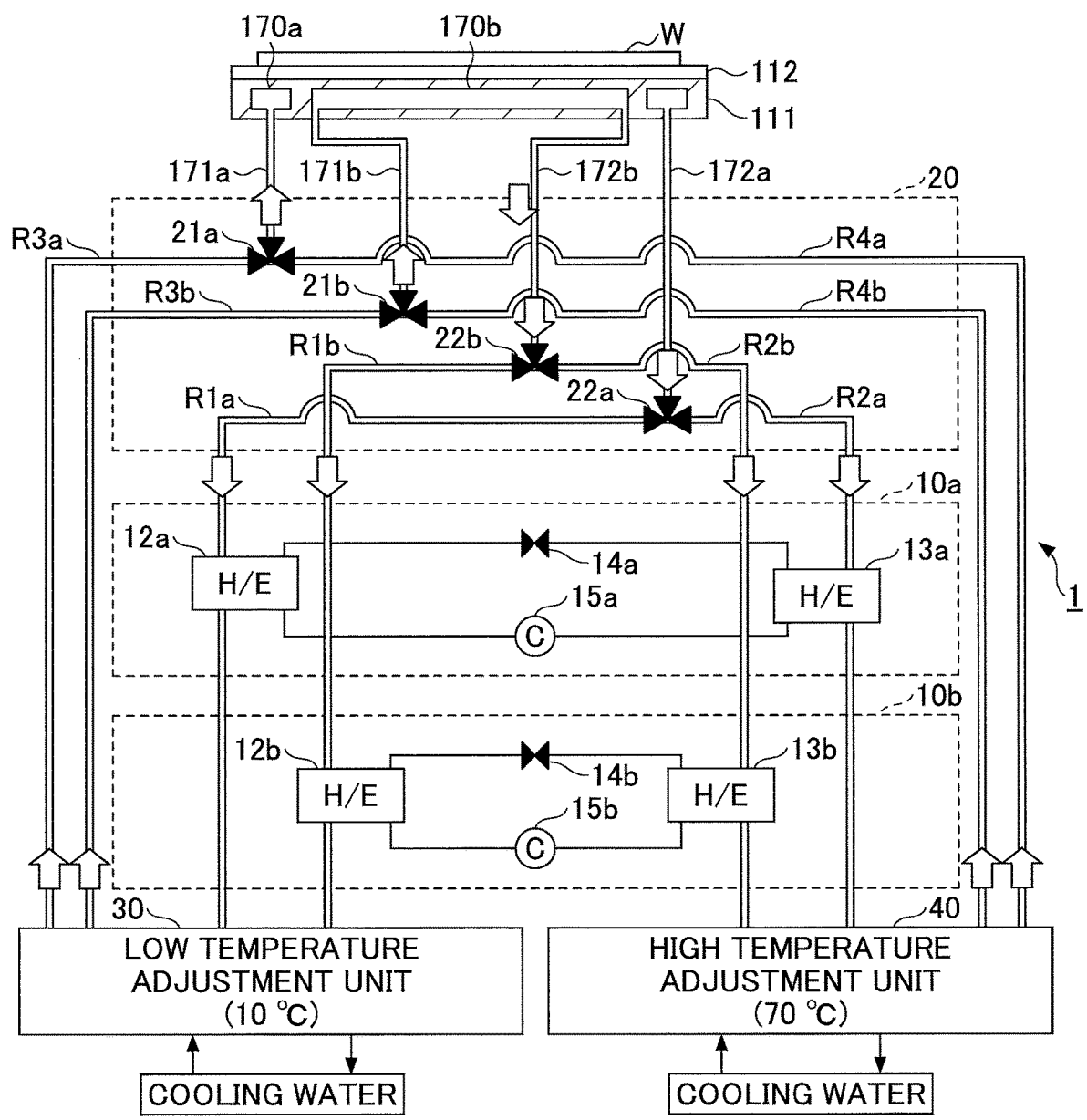
FIG. 10 illustrates an example of a temperature adjustment device according to a modified embodiment of the present invention.

Finally, a modified embodiment of the temperature adjustment device is described below with reference to FIG. 10. The temperature adjustment device 1 according to the modified embodiment in FIG. 10 differs from the temperature adjustment device 1 according to the modified embodiment in FIG. 1 in that the temperature adjustment device 1 according to the modification includes dual circulation pathways. One of the circulation pathways is constituted of the low temperature adjustment unit 30 and the high temperature adjustment unit 40→flow passages R3a and R4a→(a three-way valve 21a)→an inlet flow passage 171a→a peripheral pedestal flow passage 170a→an outlet flow passage 172a→(a three-way valve 22a)→flow passages R1a and R2a→a heat pump 10a→the low temperature adjustment unit 30 and the high temperature adjustment unit 40.

The other circulation pathway is constituted of the low temperature adjustment unit 30 and the high temperature adjustment unit 40→flow passages R3b and R4b→(a three-way valve 21b)→an inlet flow passage 171b→a central pedestal flow passage 170b→an outlet flow passage 172a→(a three-way valve 22b)→flow passages R1b and R2b→a heat pump 10b→the low temperature adjustment unit 30 and the high temperature adjustment unit 40.

In the heat pump 10a, fluorocarbon flowing through the pipe absorbs heat, evaporates and converts to a gas at the evaporator 12a, and the gas is drawn to the compressor 15, where the gas is compressed to a gas of a high temperature and a high pressure, and is sent to the condenser 13a. The brine releases heat and converts to a liquid at the condenser 13a, and returns to the evaporator 12a after the pressure of the liquid is reduced by the expansion valve 14a.

Similarly, in the heat pump 10b, fluorocarbon flowing through the pipe absorbs heat, evaporates and converts to a gas at the evaporator 12b, and the gas is drawn to the compressor 15, where the gas is compressed to a gas of a high temperature and a high pressure, and is sent to the condenser 13b. The brine releases heat and converts to a liquid at the condenser 13b, and returns to the evaporator 12b after the pressure of the liquid is reduced by the expansion valve 14b.

In this manner, in the temperature adjustment device 1 according to the modification, multiple circulation pathways are connected to the multiple pedestal flow passages 170a and 170b separately provided inside the pedestal 111, respectively. Thus, the temperature adjustment device 1 according to the modification can set the peripheral portion and the central portion at different temperatures. By doing this, temperature controllability while processing the wafer W, can be improved. Moreover, in the temperature adjustment device 1 according to the modification, two of the heat pumps 10a and 10b are provided. Thus, the heat load caused by the brine returning to the low temperature adjustment unit 30 and the high temperature adjustment unit 40 can be further reduced.

Although the temperature adjustment device 1 according to the modification includes two circulation pathways, the number of the circulation pathways is not limited to this example, and may be three or more. Furthermore, the flow passages R1, R1a and R1b described above are examples of the first flow passage. The flow passages R2, R2a and R2b are examples of the second flow passage.

As discussed above, the temperature adjustment devices 1 according to the present embodiment and the modification can reduce the heat load caused by the brine returning to two or more different temperature adjustment units. In other words, the temperature adjustment devices 1 according to the present embodiment and the modification can reduce the heat load caused by the brine returning to the low temperature adjustment unit 30 and the high temperature adjustment unit 40 by providing the heat pump 10, 10a and 10b that transfer heat between the high temperature brine and the low temperature brine returning to the chiller during the switch. As a result, it is possible to prevent the increase in the cost of power due to the heat load caused by the brine returning to the low temperature adjustment unit 30 and the high temperature adjustment unit 40.

In addition, it is possible to prevent the deterioration of durability of the low temperature adjustment unit 30 and the high temperature adjustment unit 40 due to heat shock caused by mixing the low temperature brine with the high temperature brine.

As discussed above, according to the embodiments of the present invention, a heat load caused by a medium controlled by two or more different temperature control units can be reduced.

Although a temperature adjustment device and a substrate processing apparatus are described in the above embodiments, the temperature adjustment device and the substrate processing apparatus of the present invention are not limited to the embodiments. In this regard, numerous variations and modifications are possible without departing from the scope of the present invention, and may be appropriately determined depending on such variations and modifications that may be made.

A temperature adjustment device and a substrate processing apparatus of the present invention can be applied not only to a capacitively coupled plasma (CCP: Capacitively Coupled Plasma) apparatus schematically illustrated in FIG.

1, but also to other substrate processing apparatuses. The other substrate processing apparatuses include an inductively coupled plasma (ICP: Inductively Coupled Plasma) apparatus, a plasma processing apparatus using a radial line slot antenna, a helicon wave excited plasma (HWP: Helicon Wave Plasma) apparatus, and an electron cyclotron resonance plasma (ECR: Electron Cyclotron Resonance Plasma) apparatus.

Although the wafer W (semiconductor) is described as an etching object in the present specification, a substrate to be processed is not limited to the wafer W. A variety of substrates used in an LCD (Liquid Crystal Display), an FPD (Flat Panel Display) and the like, a photomask, a CD substrate, a printed board and the like may be used as the substrate to be processed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A temperature adjustment device comprising:
   a pedestal to receive a substrate thereon for processing;
   a first temperature control unit including a first heat exchanger and configured to control a temperature of a first temperature adjustment medium to a first temperature using the first heat exchanger;
   a second temperature control unit including a second heat exchanger and configured to control a temperature of a second temperature adjustment medium to a second temperature that is higher than the first temperature using the second heat exchanger;
   a pedestal flow passage, provided inside the pedestal, to allow the first temperature adjustment medium and the second temperature adjustment medium to flow therethrough by switching between the first temperature adjustment medium and the second temperature adjustment medium;
   an outlet flow passage connected to an outlet of the pedestal flow passage to allow the first temperature adjustment medium and the second temperature adjustment medium flowing out of the pedestal flow passage to flow therethrough;
   a three-way valve connected to a downstream end of the outlet flow passage;
   a first flow passage connected to the three-way valve and through which the first temperature adjustment medium flowing out of the pedestal flow passage is allowed to flow;
   a second flow passage connected to the three-way valve and through which the second temperature adjustment medium flowing out of the pedestal flow passage is allowed to flow;
   a heat pump that is disposed downstream of the three-way valve in flow directions of the first temperature adjustment medium and the second temperature adjustment medium and has an evaporator directly connected to the first flow passage and a condenser directly connected to the second flow passage and is configured to transfer heat between the first temperature adjustment medium and the second temperature adjustment medium using a circular flow passage, the circular flow passage forming a closed loop directly connecting the evaporator and the condenser;
   a third flow passage that connects the first temperature control unit to the pedestal flow passage and is provided separately from the heat pump; and
   a fourth flow passage that connects the second temperature control unit to the pedestal flow passage and is provided separately from the heat pump.

2. The temperature adjustment device as claimed in claim 1,
   wherein the first temperature control unit sets the first temperature at −30 degrees C. or higher, and
   the second temperature control unit sets the second temperature at 70 degrees C. or lower.

3. The temperature adjustment device as claimed in claim 1, wherein the heat pump includes a controller configured to control the temperature of the first temperature adjustment medium and the temperature of the second temperature adjustment medium based on a temperature obtained from a temperature sensor provided in each of the first flow passage and the second flow passage.

4. The temperature adjustment device as claimed in claim 1, further comprising:
   a second pedestal flow passage provided inside the pedestal separately from the pedestal flow passage to allow the first temperature adjustment medium and the second temperature adjustment medium to flow therethrough by switching between the first temperature adjustment medium and the second temperature adjustment medium;
   a fifth flow passage through which the first temperature adjustment medium flowing out of the pedestal flow passage is allowed to flow;
   a sixth flow passage through which the second temperature adjustment medium flowing out of the pedestal flow passage is allowed to flow; and
   a second heat pump connected to the fifth flow passage and the sixth flow passage and configured to transfer heat between the first temperature adjustment medium and the second temperature adjustment medium,
   wherein each of the second pedestal flow passage, the fifth flow passage, the sixth flow passage, and the second heat pump has the same number, and the same number of loop is independently formed by correspondingly connecting the same number of the second pedestal flow passage, the fifth flow passage, the sixth flow passage, and the second heat pump with each other.

5. The temperature adjustment device as claimed in claim 1,
   wherein the heat pump uses the evaporator and the condenser in the circular passage to transfer heat between the first temperature adjustment medium and the second temperature adjustment medium.

6. A substrate processing apparatus comprising:
   a process chamber to process a substrate therein;
   a pedestal provided in the process chamber to receive the substrate thereon;
   a first temperature control unit including a first heat exchanger and configured to control a temperature of a first temperature adjustment medium to a first temperature using the first heat exchanger;
   a second temperature control unit including a second heat exchanger and configured to control a temperature of a second temperature adjustment medium to a second temperature that is higher than the first temperature using the second heat exchanger;

a pedestal flow passage provided, inside the pedestal, to allow the first temperature adjustment medium and the second temperature adjustment medium to flow therethrough by switching between the first temperature adjustment medium and the second temperature adjustment medium;

an outlet flow passage connected to an outlet of the pedestal flow passage to allow the first temperature adjustment medium and the second temperature adjustment medium flowing out of the pedestal flow passage to flow therethrough;

a three-way valve connected to a downstream end of the outlet flow passage;

a first flow passage connected to the three-way valve and through which the first temperature adjustment medium flowing out of the pedestal flow passage is allowed to flow;

a second flow passage connected to the three-way valve and through which the second temperature adjustment medium flowing out of the pedestal flow passage is allowed to flow;

a heat pump that is disposed downstream of the three-way valve in flow directions of the first temperature adjustment medium and the second temperature adjustment medium and has an evaporator directly connected to the first flow passage and a condenser directly connected to the second flow passage and configured to transfer heat between the first temperature adjustment medium and the second temperature adjustment medium using a circular flow passage, the circular flow passage forming a closed loop directly connecting the evaporator and the condenser;

a third flow passage that connects the first temperature control unit to the pedestal flow passage and is provided separately from the heat pump; and a fourth flow passage that connects the second temperature control unit to the pedestal flow passage and is provided separately from the heat pump.

7. The substrate processing apparatus as claimed in claim 6, wherein the heat pump uses the evaporator and the condenser in the circular passage to transfer heat between the first temperature adjustment medium and the second temperature adjustment medium.

\* \* \* \* \*